United States Patent
Boon et al.

(10) Patent No.: US 6,380,048 B1
(45) Date of Patent: Apr. 30, 2002

(54) DIE PADDLE ENHANCEMENT FOR EXPOSED PAD IN SEMICONDUCTOR PACKAGING

(75) Inventors: Tan Hien Boon; Zheng Zheng; Arnel Trasporto, all of Singapore (SG)

(73) Assignee: St Assembly Test Services Pte Ltd, Singapore (SG)

( * ) Notice: Subject to any disclaimer, the term of this patent is extended or adjusted under 35 U.S.C. 154(b) by 0 days.

(21) Appl. No.: 09/920,599

(22) Filed: Aug. 2, 2001

(51) Int. Cl.$^7$ ............................................... H01L 21/46
(52) U.S. Cl. ....................................... 438/456; 257/668
(58) Field of Search ................................. 438/118, 108, 438/120, 126, 459, 456, 111, 611–613, 121–123; 257/668, 672, 676, 678, 786, 787, 698, 792

(56) References Cited

U.S. PATENT DOCUMENTS

| | | | |
|---|---|---|---|
| 5,543,657 A | 8/1996 | Diffenderfer et al. | 257/666 |
| 5,639,694 A | 6/1997 | Diffenderfer et al. | 437/209 |
| 5,814,877 A | 9/1998 | Diffenderfer et al. | 257/666 |
| 5,942,794 A | 8/1999 | Okumura et al. | 257/666 |
| 5,977,626 A | 11/1999 | Wang et al. | 257/707 |
| 6,331,451 B1 * | 12/2001 | Fusaro et al. | 257/702 |

OTHER PUBLICATIONS

U.S. Patent Application Ser. No. 09/395,923 filed on Sep. 14, 1999, Titled "Leadframe Based Chip Scale Package and Method of Producing the Same", assigned to a common assignee.

* cited by examiner

*Primary Examiner*—David Nelms
*Assistant Examiner*—David Vu
(74) *Attorney, Agent, or Firm*—George O. Saile; Stephen B. Ackerman (57) ABSTRACT

A new design is provided for the die-paddle that is used as part of a package for packaging semiconductor devices. The new design of the invention creates a space between the ground ring of the die-paddle and the surface over which the ground paddle is mounted. The new design further comprises an S-shaped segment between the ground ring and the center of the die-paddle, the S-shaped segment provides stress relieve between the ground ring and the center of the die-paddle.

16 Claims, 12 Drawing Sheets

DIE PADDLE ENHANCEMENT FOR EXPOSED PAD IN SEMICONDUCTOR PACKAGING

BACKGROUND OF THE INVENTION (1) Field of the Invention

The invention relates to the fabrication of integrated circuit devices, and, more particularly, to a method and package for packaging semiconductor die in such a manner that die-paddle surface delamination is prevented.

(2) Description of the Prior Art

The semiconductor industry has for many years achieved improvements in the performance of semiconductor devices by device miniaturization and by increasing the device packaging density. For this purpose, metal interconnects can readily be provided by metal lines that are embedded in layers of dielectric, using vias to provide electrical connections between overlying layers of interconnect lines. Interconnect lines must thereby be connected in such a manner that optimum performance can be realized for the completed package. Good planarity must also be maintained between adjacent layers of interconnect lines because metal interconnect lines are typically narrow in width and thick in a vertical direction (in the range of 5 to 10 microns thick) and must be patterned with microlithography. Patterned layers must therefore be substantially flat and smooth (i.e. have good planarity) so that these layers can serve as a base for the next layer.

One of the original approaches that has been used to create surface mounted, high pin-count integrated circuit packages has been the use of the Quad Flat Pack (QFP) with various pin configurations. For the QFP, closely spaced leads along the four edges of the flat package are used for making electrical connections from where the electrical connections are distributed to the surrounding circuitry. The QFP has found to be cost-effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package. More contact points with greater spacing between the contact points can therefore be allocated across the BGA package than was the case with the QFP.

Flip Chip packages have in general been used to accommodate increased I/O count combined with increased high requirements for high performance Integrated Circuits. Flip chip technology fabricates bumps (typically Pb/Sn solder) on aluminum pads and interconnects the bumps directly to the packaging media, which are usually ceramic or plastic based substrates. The flip-chip is bonded face down to the package through the shortest paths. This approach can be applied to single-chip packaging and to higher levels of integrated packaging (in which the packages are larger) and to more sophisticated packaging media that accommodate several chips to form larger functional units.

For the packaging of semiconductor devices, the packages in which the devices are contained provide protection of the device from environmental influences such as mechanical damage or damage caused by moisture affecting exposed surfaces of the device. Part of the package design includes the design of electrically conductive interfaces that enable the device to be electrically interconnected with surrounding circuitry. Increased device density has not only created new demands for input/output connections of the device but has also caused considerable more thermal energy to be expanded per cubic volume content of the device. In many of the semiconductor device packages, the device is mounted in close physical proximity to a heat sink. This is combined with methods, such as connections of low resistance to thermal heat conductivity, that are implemented as part of the package.

U.S. Pat. No. 5,977,626 (Wang et al.) shows an enhanced PBGA package with a ground ring and die-paddle.

U.S. Pat. No. 5,1814,877 (Diffenderfer et al.), U.S. Pat. No. 5,639,694 (Diffenderfer et al.), U.S. Pat. No. 5,543,657 (Diffenderfer et al.) show packages with ground ring and die-paddle configurations.

U.S. Pat. No. 5,942,794 (Okumura et al.) provides for a plastic encapsulated semiconductor device package using related technologies.

U.S. patent application Ser. No. 09/395,923, filed on Sep. 14, 1999, Titled "Leadframe Based Chip Scale Package and Method of Producing the Same", assigned to a common assignee.

SUMMARY OF THE INVENTION

A principle objective of the invention is to provide a method and package of an enhanced die-paddle design.

Another objective of the invention is to provide a leadframe of reduced internal stress for the mounting of semiconductor devices.

Yet another objective of the invention is to provide a leadframe of an improved interlocking design for the mounting of semiconductor devices.

A still further objective of the invention is to provide a leadframe for the mounting of semiconductor devices that provides the required shielding of the package against drastic environmental changes.

In accordance with the objectives of the invention a new design is provided for the die-paddle that is used as part of a package for packaging semiconductor devices. The new design of the invention creates a space between the ground ring of the die-paddle and the surface over which the ground-paddle is mounted. The new design further comprises an S-shaped segment between the ground-ring and the center of the die-paddle, the S-shaped segment provides stress relieve between the ground-ring and the center of the die-paddle.

BRIEF DESCRIPTION OF THE DRAWINGS

FIGS. 4a through 4c show the enhanced die-paddle design of the invention and its implementation, as follows:

DESCRIPTION OF THE PREFERRED EMBODIMENTS

Figure 1:
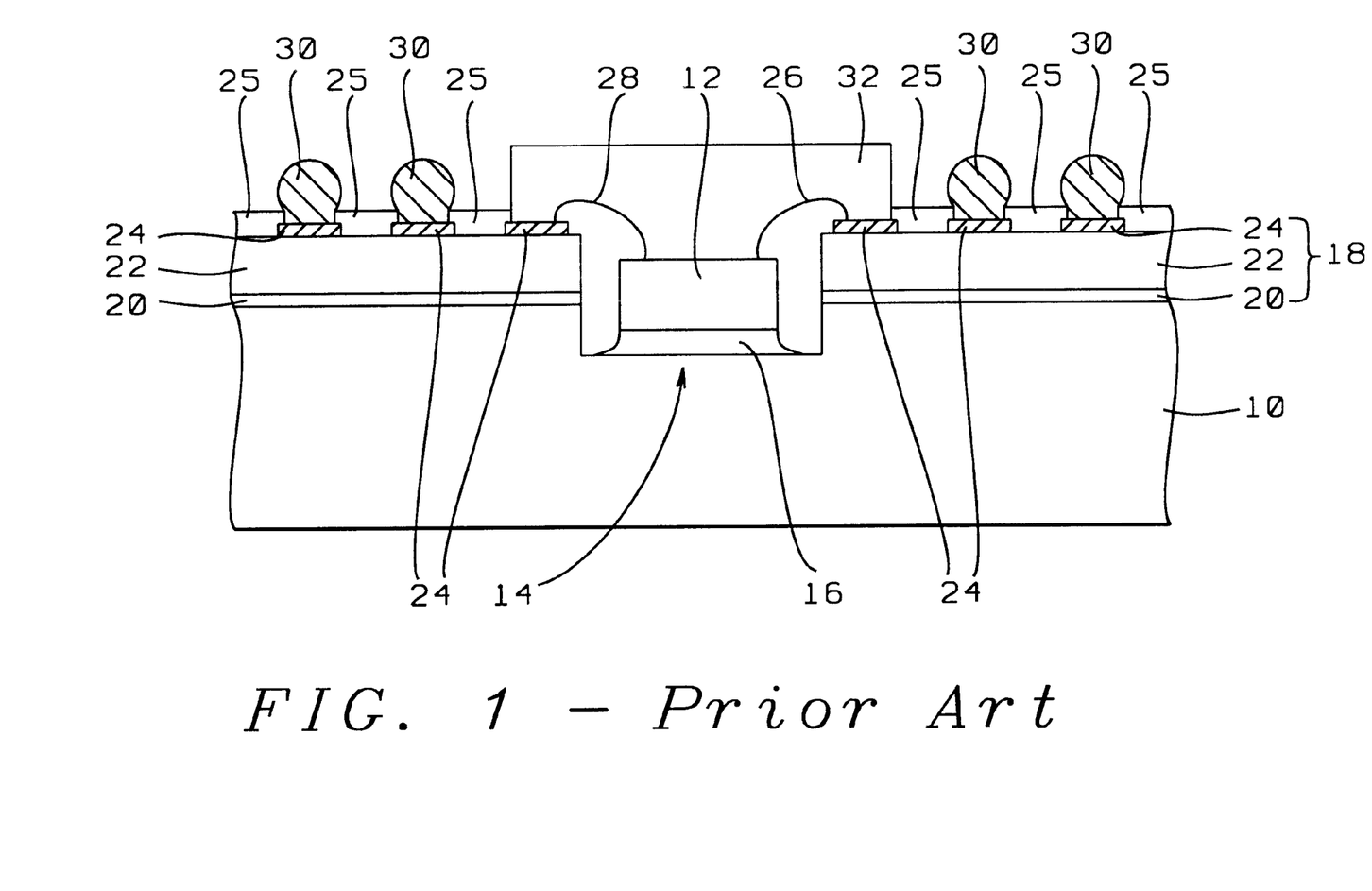
FIG. 1 shows a cross section of a first Prior Art flip-chip package, a major part of the package is a heatsink.

FIG. 1 shows an example of a Prior Art method of packaging a flip chip whereby a major part of the package is a heatsink 10.

The elements that are shown in cross section in FIG. 1 are the following:

- 10, a heatsink; heatsink 10 has a surface that is electrically conductive
- 12, a semiconductor die; the semiconductor die 12 is mounted in the center of the package; contact points to die 12 (not shown) are closely spaced around the periphery of die 12
- 14, a cavity provided in the heatsink 10 for the mounting of the Integrated Circuit (IC) chip 12
- 16, a thin adhesive layer of thermally conductive epoxy that is deposited over the bottom surface of cavity 14; the top surface of the IC chip 12 is in close physical contact with the heatsink 10 via adhesive layer 16, the IC die 12 is attached to the heatsink 10 by means of layer 16; the adhesive layer 16 is cured after the IC die 12 has been inserted into cavity 14
- 18, a substrate shown as containing three layers, that is layers 20, 22 and 24
- 20, a layer of substrate 18 which is typically an adhesive layer that directly connects the substrate 18 to the heatsink 10; this establishes the necessary mechanical support for a wire bonding operation
- 22, layer of substrate 18 that can contain a stiffener, providing rigidity to substrate 18
- 24, a layer of substrate 10 containing copper traces that interconnect the solder balls 30 to surrounding circuitry
- 25, a solder mask layer (typically a layer of dielectric) with openings created therein, deposited over the surface of substrate 18; the openings in solder mask 25 expose the copper traces in layer 24 to provide solder connections between the copper traces of layer 24 and contact balls 30
- 28, wires that provide wire bond connections between contact points (not shown) on the IC die 12 and copper traces contained in layer 24 of the substrate 18; the contact points of the die 12 are conductively bonded in this manner, using wire-bonding techniques, to the substrate 18
- 30, contact balls for further interconnection of the package shown in cross section in FIG. 1, and
- 32, an encapsulation that surrounds die 12; it must be noted that the encapsulation 32 not only surrounds the IC die 12 but also covers the bond wires 26 and 28; the encapsulation layer 32 is cured after injection.

Figure 2:
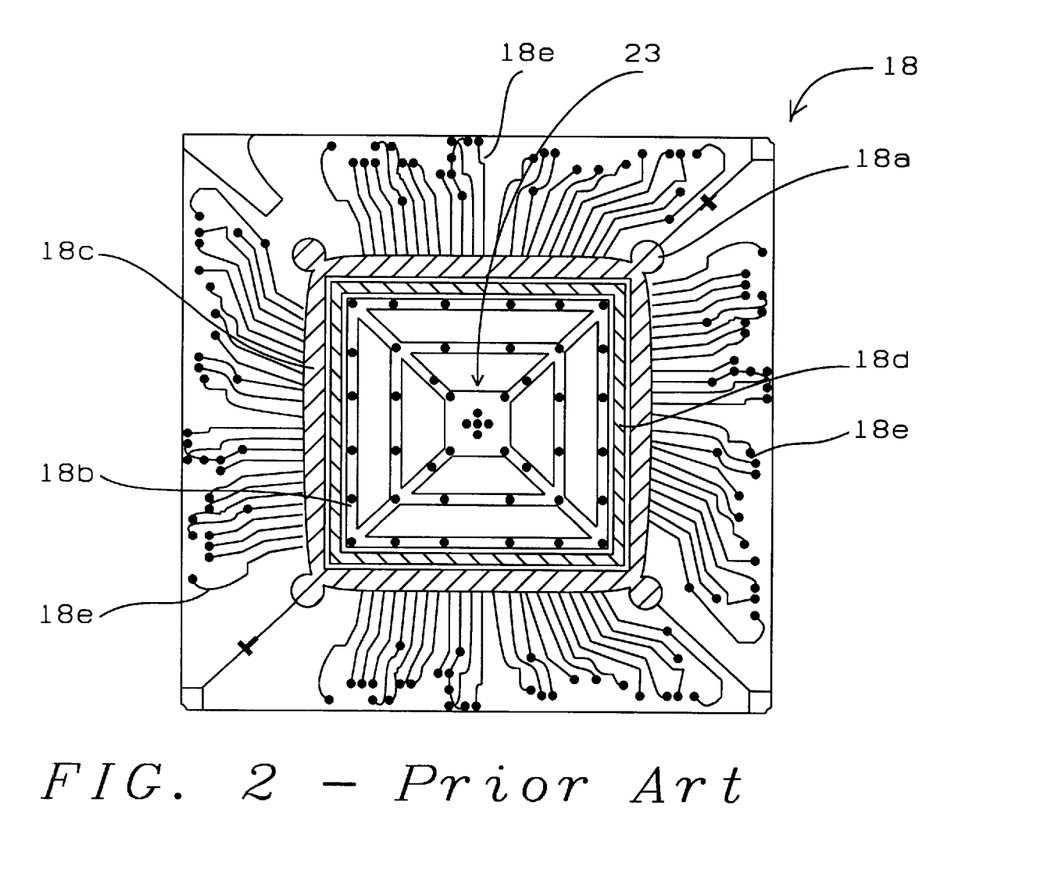
FIG. 2 shows a top view of a Prior Art substrate that is used for packaging semiconductor devices.

As an example of a top view of a substrate that is used for packaging semiconductor devices, a top view is shown in FIG. 2 of a substrate 18, entered from U.S. Pat. No. 5,9677,626 (Wang et al.) for purposes of reference. For clarity of understanding, it must be pointed out that the semiconductor device that is mounted on the surface of substrate 18 is aligned with (mounted above) the center 23 of the substrate 18 that is shown in top view in FIG. 2. The side surfaces of the semiconductor device are, after the device has been mounted on the surface of the substrate 18, parallel with the sides or boundaries of the substrate (not highlighted) as shown in FIG. 2. The semiconductor device overlies the surface of substrate 18 over an area that is bounded by the structure 18b, the die-paddle that is shown in FIG. 2.

Highlighted in FIG. 2 are the following details, all highlighted details are part of a conductive pattern that is created on the surface of the substrate 18. As follow:

- 18a are (four) ground pads that are located in (four) corners of the surface area of the substrate 18 over which the semiconductor device is mounted; these (four) ground pads 18a are conductively interconnected (see item 18c below)
- 18b is a conductive ring surrounding the center 23 (over which the semiconductor die is mounted) of substrate 18
- 18c is the ground ring of the device mounting network
- 18d is the power ring on the surface of the substrate 18
- 18e are metal traces that connect the perimeter of the semiconductor device with the perimeter of the substrate 18 for further interconnect of the device.

Figure 3:
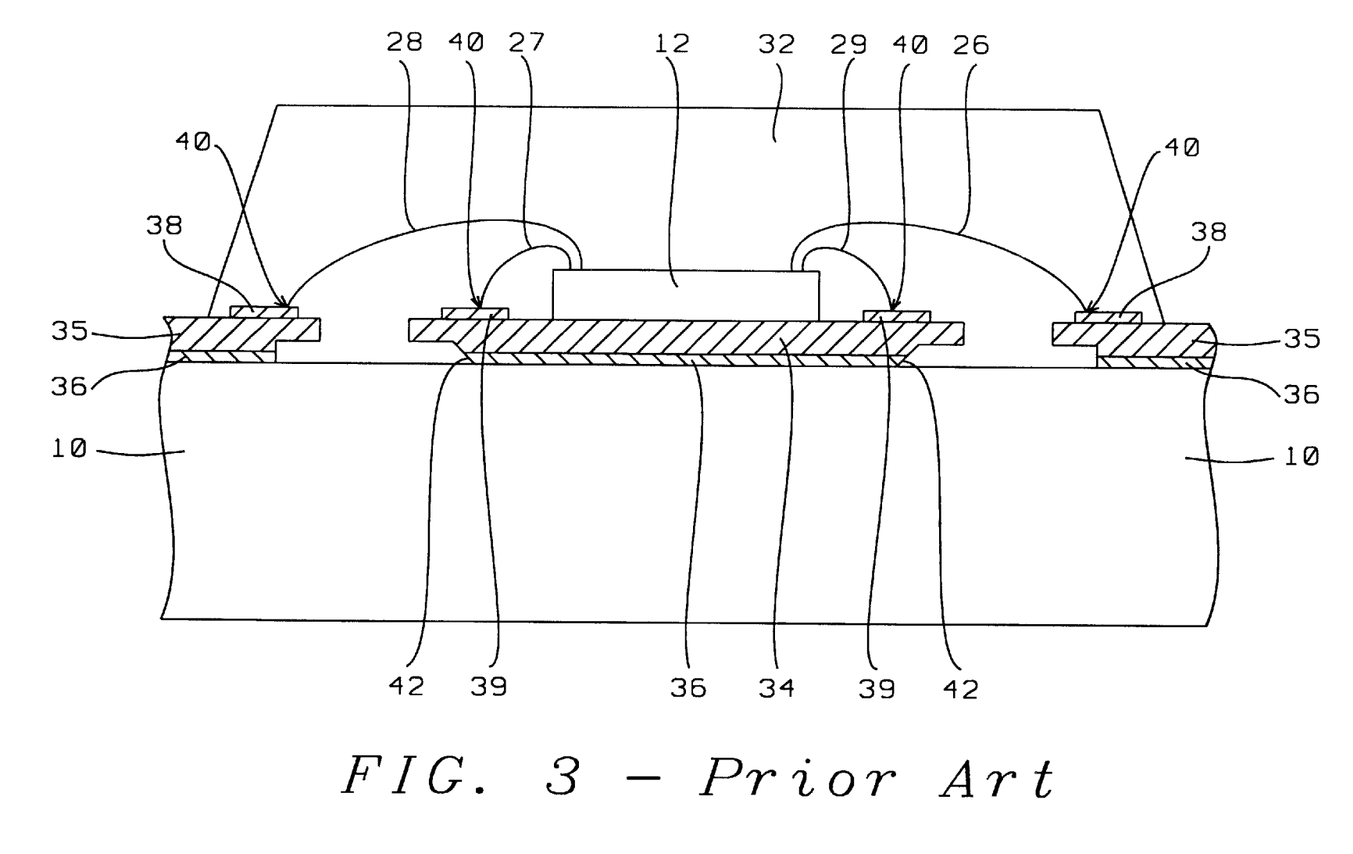
FIG. 3 shows a cross section of a second Prior Art flip-chip package.

As a final prior art method of packaging a semiconductor device, the cross section of FIG. 3 is introduced. Shown in FIG. 3 are the following elements:

- 10, a heat sink
- 12, a semiconductor die that is mounted in the package of the cross section shown in FIG. 3
- 26 and 28, two signal wires that are connected to points 38 of electrical contact on the surface of die 12; these signal wires interconnect the die 12 with electrical traces 38 for further interconnection of the die 12 to surrounding circuitry
- 27 and 29, two ground wires that provide short and low resistivity ground interconnects between the ground points (not shown) on the surface of die 12 and ground points of interconnect 39 on the surface of the die-paddle 34
- 32, an encapsulation compound that surrounds die 12 and that further encapsulates bond wires 26, 27, 28 and 29
- 34, a cross section of the exposed die-paddle on the surface of which semiconductor die 12 is mounted; the purpose of the die-paddle 34 is to enable and to enhance heat dissipation from the die 12 to surrounding surfaces, typically the surface of heat sink 10; in addition the die-paddle 34 provides the ability for short and improved ground connections between the die 12 and the heat sink 10
- 35, the leadframe providing support for metal traces 38 that connect the semiconductor device 12 with surrounding circuitry; these metal traces are similar to the metal traces 18e in FIG. 2; it must be noted that elements 34 (the die-paddle), 35 and metal traces 38 and 39 are all part of and constitute the leadframe
- 36, solder plating that is used as an interface between the leadframe (including the die-paddle 34) and the heat sink 10

38 and 39, a (silver) plating base that is created on the
surface of leadframe (including the surface of the
die-paddle 34) for purposes of providing points of
electrical interconnect with bond wires 26–29

The cross-section that is shown in FIG. 3 specifically
indicates problem areas that arise using the conventional
method of mounting a semiconductor device, of which the
cross-section of FIG. 3 is representative. These problems
are:

the areas highlighted with 40, which are the points where
the bond wires 26–29 connect to the plating base 38 and
39; it has been found that bond reliability at these points
is poor, leading to high product-yield losses; this effect
is especially acute during solder reflow and is caused
by the significant mismatch of the Coefficient of Thermal Expansion (CTE) between the interfacing elements the areas highlighted with 42, these areas of exposure
provide paths of relatively easy moisture penetration
during the process of assembly of the package; the
moisture that penetrates in this manner is prone to
evaporate during reflow and during high temperature
processing, causing additional stress in the surface of
the die-paddle.

The problem of the device package that is shown in FIG.
3 can be summarized as follows. Die-paddle delamination
has been a major problem for die-paddles that are exposed
during the process of assembling the package. Electrical
performance is typically enhanced by providing proper
grounding of the semiconductor device with, as previously
highlighted, providing bonding wires between the die and
the die-paddle and from the die-paddle leads to ground.
However, reliability of the therefore required bonding interconnections is significantly compromised by delamination
of the solder plating 36 that is used as an interface between
the leadframe (points 42, FIG. 3) and the silver plating
interface (points 40, FIG. 3). Especially, for products that
contain a die-paddle that is exposed during the process of
package assembly, the moisture penetration is of more
serious concern than for product that contains a standard
embedded die-paddle.

The primary factors causing delamination of the top
surface of the die-paddle (points 40, FIG. 3) are:

mismatch of the Coefficient of Thermal Expansion (CTE)
between interfacing surfaces and materials a weak interlocking mechanism between the epoxy that is
used in the package and the leadframe of the package,
and exposure of bonded surfaces (through the exposed die-paddle) to drastic changes in environmental conditions
such as changes in temperature or moisture exposure.

The invention addresses the above highlighted concerns
in providing a unique leadframe configuration that provides
stress relieve, interlock enhancement and proper shielding of
sensitive areas against drastic changes in environmental
conditions. The design of the invention reduces the previously experienced delamination and bond reliability (points
40 and 42, FIG. 3), which have a negative impact on
establishing proper ground connections between the semiconductor die of the package and the die-paddle and
between the die-paddle and thereto connected leads.

The invention focuses on aspects of the die-paddle design,
that is element 34 is shown in cross section in FIG. 3.
Specifically, the invention addresses the design of a physical
interface between the ground-ring that forms part of the
leadframe, that is element 18c of FIG. 2, and the die-paddle,
that is the element of FIG. 2 that is surrounded by the
ground-ring (element 18c of FIG. 2) of the leadframe.

The two aspects of the die-paddle that the invention
concentrates on are:

a ground-ring is provided by using "half-etching"
technology, which results in providing a mechanical
interface (also referred to as an "S-bar" due to the shape
in which this interface is created) between the ground-ring and the die-paddle, the mechanical interface having a lower surface that is in a plane that is above the
plane of the lower surface of the die-paddle, and the S-bar is provided as part of (an extension to) the
ground-ring; this S-bar, which is structurally part of the
ground-ring, has been designed in such a way that the
S-bar provides stress relieve to the ground-ring.

To further place the invention in the proper perspective, it
must be realized that die-paddle 34, shown in cross section
in FIG. 3, is of metal, preferably containing copper. The
silver plating 39 shown in FIG. 3 forms a ground ring that,
in the cross section that is shown in FIG. 3, is created on the
surface of the die-paddle 34. Leads 27 and 29 therefore
provide short paths for grounding points of ground on the
surface of die 12 (not shown) through the ground ring 39,
through the die-paddle 34 and through the solder plating 36
underneath die-paddle 34 to the heatsink 10. The invention
specifically addresses the design of the die-paddle and the
surrounding ground-ring and further provides for a physical
interface, further referred to as an S-bar, between the die-paddle and the ground-ring.

Figure 4A:
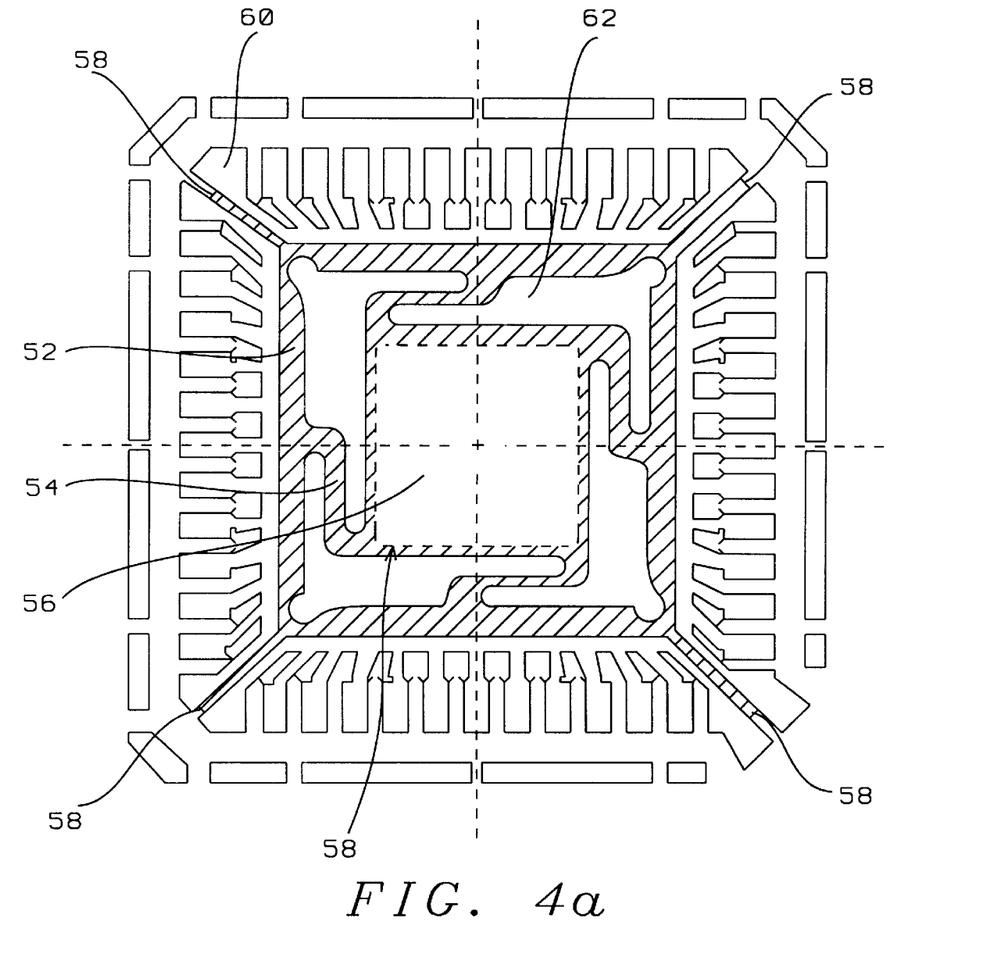
FIG. 4a shows a top view of the enhanced die-paddle design of the invention.
Figure 4B:
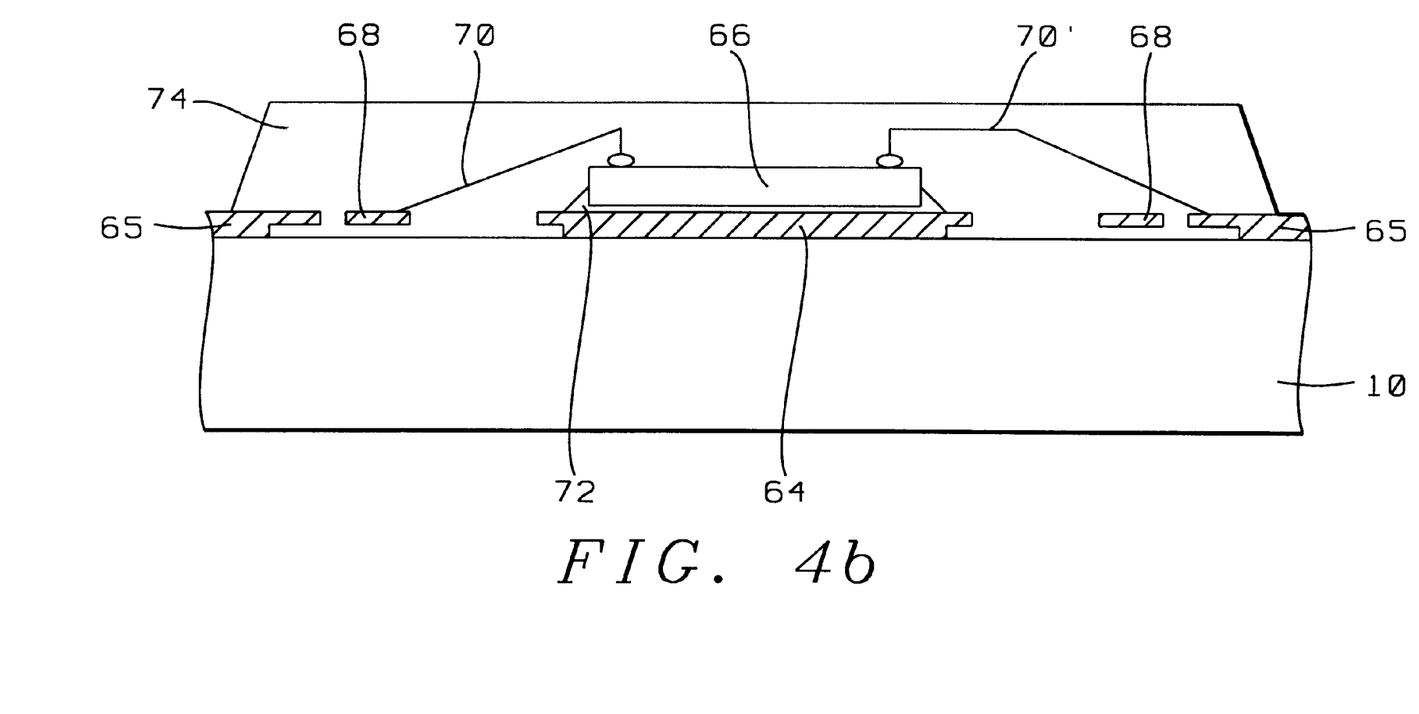
FIG. 4b shows a cross section of semiconductor device package in which the enhanced die-paddle design of the invention has been implemented.
Figure 4C:
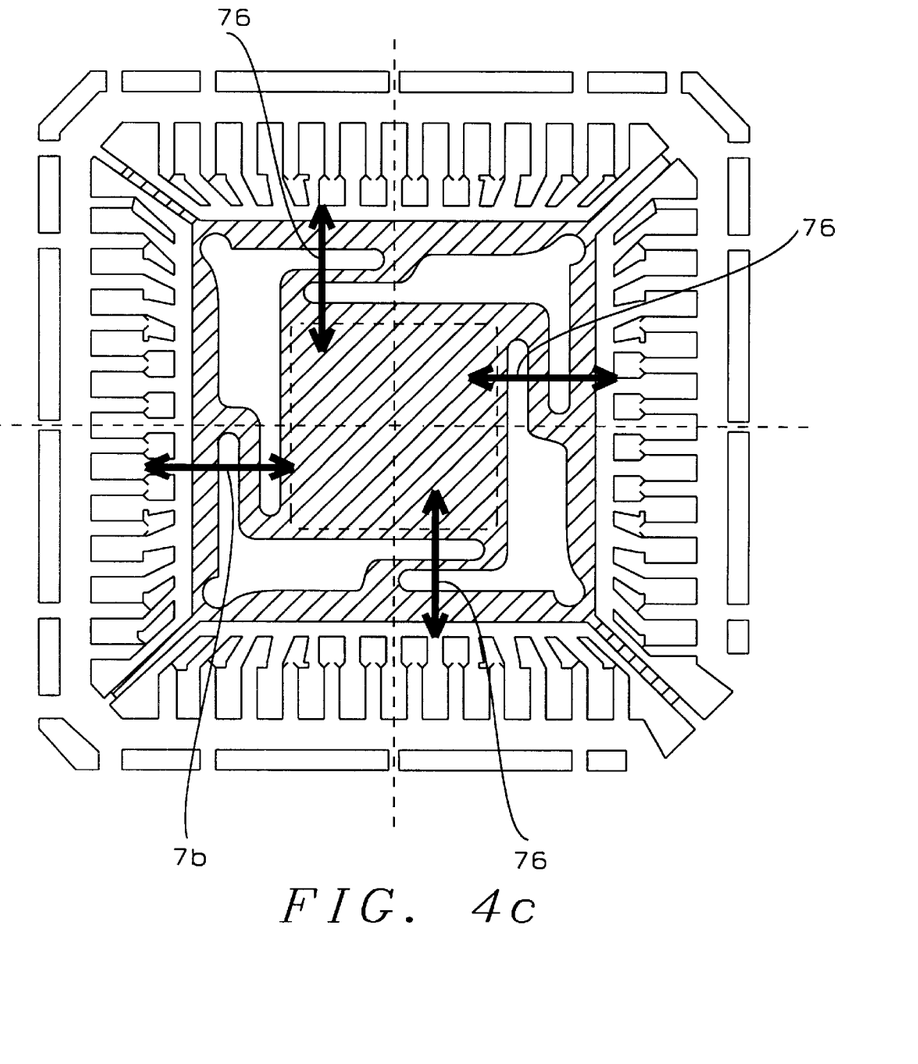
FIG. 4c shows a top view of the enhanced die-paddle design of the invention, highlighting areas where stress relieve is provided by the spring effect that is created by the S-bars of the enhanced die-paddle design of the invention.

The structural details of the special design, which will be
further highlighted at a later time using FIGS. 4a through 4c,
are best explained as follows:

the ground ring, as indicated, is etched such that there is
a distance between the ground ring and the surface on
which the die-paddle rests. The ground ring therefore
"floats" in the molding compound in which the device
is embedded the S-bar (of which a multiplicity is created, for instance
two or four, symmetrically surrounding the die-paddle),
which is structurally part of the ground ring, extends
between the ground ring and the die-paddle and therefore connects the ground ring with the die-paddle (the
die-paddle being the region on the surface of the
leadframe that is surrounded by the ground ring and
above which the die is mounted, that is the region that
is surrounded by ground ring 18c in FIG. 2). From this
some conclusions can at this time be drawn:

the plane of the bottom surface of the embedded ground
ring, created using half-etch technology, is located
above the plane of the bottom surface of the die-paddle
and, as a consequence, is surrounded by (floats in) the
molding compound in which the die is embedded.
Moisture penetration to and effect of moisture to the
ground ring will therefore be greatly reduced the embedded ground ring provides improved protection
for the ground wires against drastic changes in environmental conditions such as temperature the S-bars, that connect the ground ring with the die-paddle, have been designed such that these S-bars
provide stress relieve to the ground ring; the S-bars are
instrumental in passing stress, that is created in the
die-paddle, onto the ground ring; the stress that is
created in the die-paddle is the result of well known
effects of thermal mismatch between interfacing and
participating components of the package such as the
die, the die attach paste, the leadframe and the molding
compound; the S-bars are designed such that they form
a "spring-like" interface between the die-paddle and the
ground ring.

The above highlighted features of the design of the invention are further shown in FIGS. 4a through 4c.

FIG. 4a shows a top view of the substrate or leadframe over which a semiconductor die is mounted. The term "leadframe" as used in this context has the conventional meaning of being the component of the semiconductor package that provides external leads or terminals to the semiconductor die, thus enabling the connection of input/output signals to the die. Highlighted in FIG. 4a are:

- 52, the ground ring of the leadframe
- 54, the S-bar of the invention; this S-bar 54 is a mechanical interface between the ground ring 52 and the die-paddle 56
- 56, the die-paddle of the leadframe
- 58, the boundaries of the half-etch area; this boundary is very important to the invention
- 60, interconnect leads that connect points of electrical interconnect on the active surface of the die (not shown) to the outer edges of the leadframe
- 62, a cut-out on the ground ring that provides interlocking enhancement between the ground ring 52 with the thereto attached S-bar 54 and the surrounding molding compound (not shown in FIG. 4a).

FIG. 4b shows a cross section of semiconductor device package in which the substrate of the invention has been implemented. The cross section that is shown in FIG. 4b is to be compared with the cross section of a standard design that previously has been shown in FIG. 3. Specifically shown are:

- 10, a heatsink; heatsink 10 has a surface that is electrically conductive
- 64, the die-paddle
- 65, the perimeter of the leadframe over which a semiconductor device is mounted
- 66, the semiconductor device mounted in the package of FIG. 4b
- 68, the ground ring of the leadframe of the invention; it must be noted from the cross section of ground ring 68 that the plane of the lower surface of the ground ring is above the plane of the lower surface of the die-paddle 64, enabling embedding of the ground ring 68 in surrounding epoxy molding 74
- 70, a ground bond-wire
- 70', a wire connecting a point of electrical contact in the surface of die 66 with a point of electrical contact on the surface of the leadframe 65
- 72, epoxy underfill of the die 66
- 74, the molding compound that encloses the package of FIG. 4b.

It must be noted in the cross section that is shown in FIG. 4b that the S-bar is not shown in this cross section. The S-bar of the invention will be highlighted in subsequent FIGS. 8a through 8c.

FIG. 4c shows a top view of the substrate of the invention. Highlighted in FIG. 4c are areas 76 where stress relieve are provided by the spring effect that is created by the S-bars of the invention.

Additional detail will now be provided that relates to the method in which the ground ring and the S-bar are created, examples of the (mechanical or physical) interfacing of the S-bar between the ground ring and the die-paddle will also be shown.

Figure 5A:
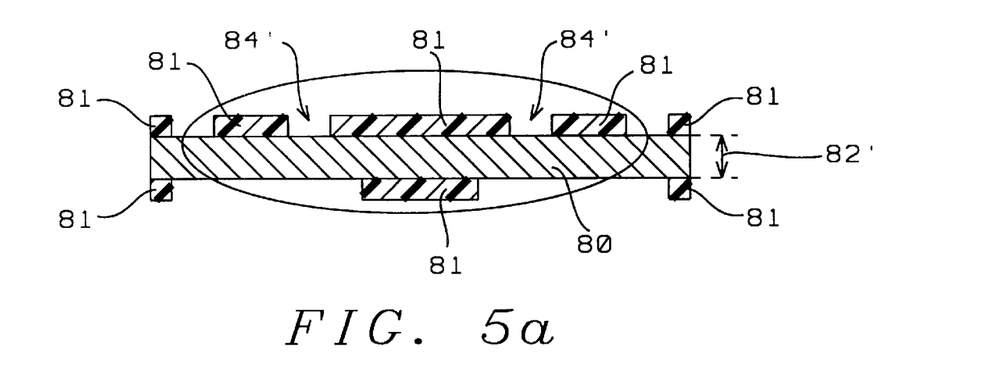
FIGS. 5a through 5d show the process that is provided for the creation of the die-paddle of the invention.

FIGS. 5a through 5d show the steps that are provided for the etching of the ground ring and the creation of the S-bar, as follows:

FIG. 5a shows a cross section of a layer 80 of metal, preferably containing copper; over the surfaces of layer 80 has been created a patterned and developed layer 81 of photoresist. The photoresist mask 81 masks the areas of the surface of layer 80 of metal that is to be left unchanged by subsequent steps of metal etch. It must be noted in the cross section that is shown in FIG. 5a that for instance in surface areas 84' the surface of layer 80 is exposed on both sides of layer 80. This means that an etch, which etches both sides of the surface of layer 80, will quickly remove the layer of metal from opposing sides of layer 80, simultaneously etching both sides of layer 80 and completely etching through layer 80 while other portions of layer 80 (those portions which are protected by the photoresist mask 81 over at least one of the two surfaces of layer 80) are still partially in place. This means that a "pattern" can be etched through the layer 80 of metal, this also means that a pattern of metal can remain in place (interwoven) between the pattern of metal that is removed. To put this in terms that are directly applicable to the invention: by proper selection of the creation of the dual (on both sides of layer 80) photoresist mask and by etching the layer 80 of metal (copper) from both sides, it is possible to leave in place a pattern of metal that for instance has the shape of an "S", the "S-bar" of the invention. It is, using the same approach, further possible, to not affect the thickness of the layer 80 of metal by creating a photoresist mask whereby photoresist is in place over opposing regions of the two surfaces of layer 80. As a third alternative must be mentioned that, by providing a photomask on only one of two opposing surfaces of layer 80, the layer 80 can be partially removed from the side of the layer 80 over which no photoresist mask is provided. In sum: a dual photomask, created over opposing surfaces of layer 80, can result in no removal of layer 80, partial removal or complete removal.

Figure 5B:
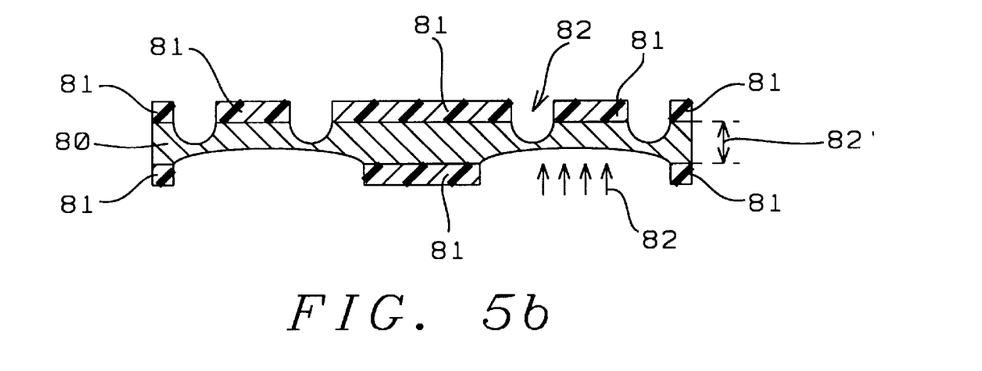

FIG. 5b shows a cross section during the process of etching layer 80 of metal (copper) during the etch of the copper surface in accordance with the photoresist mask 81. The etch 82 of the layer 80 of metal is affected from both sides of the layer 80, simultaneously etching the bottom and the top surface of layer 80.

Figure 5C:
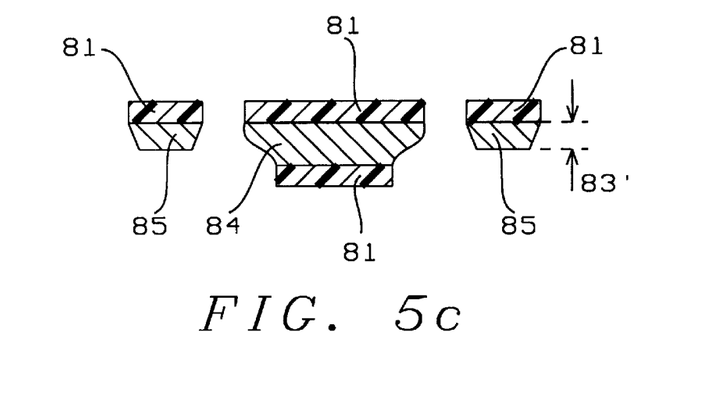

FIG. 5c shows a cross section that illustrates that the etching of layer 80 stops at the point where the thickness of layer 80 has been reduced to half of the original thickness of this layer 80, that is: 83'=82'/2. This concept is referred to as performing a half-etch of the layer of metal, by controlling the etch time the thickness of the remaining layer 80 of copper can be controlled, in this case to the point where the thickness is reduced to half the original thickness of layer 80.

From the cross section of FIG. 5c it can be observed that:
- for the die-paddle 84, the layer of metal retains the original thickness of layer 80, corner etching 88 has been achieved for the die-paddle
- for the ground ring 85 the thickness of the layer 80 has been reduced by a factor of two
- between the die-paddle 84 and the ground ring 85, all the metal of layer 80 has been removed, creating openings 84' between these elements 84 and 85
- the above observed characteristics of the etching of layer 80 can be extended to where a pattern of metal remains in place forming for instance the "S-bars" of the invention; this S-bar can be etched so that it connects to and extends between the ground ring 85 and the die-paddle 84; both the "S-bars" and the ground ring can have a height that is half (or any selected value of the original thickness (82', FIG. 5a) of layer 80.

Figure 8A:
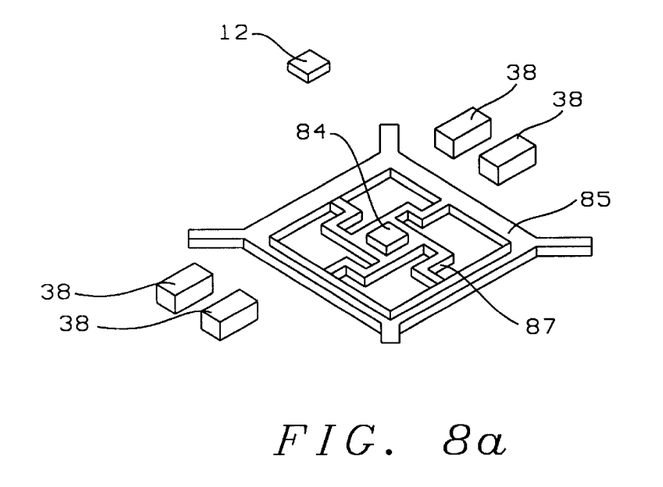
FIGS. 8a through 8c shows three dimensions view and a cross section of the die-paddle design of the invention and its application.
Figure 8B:
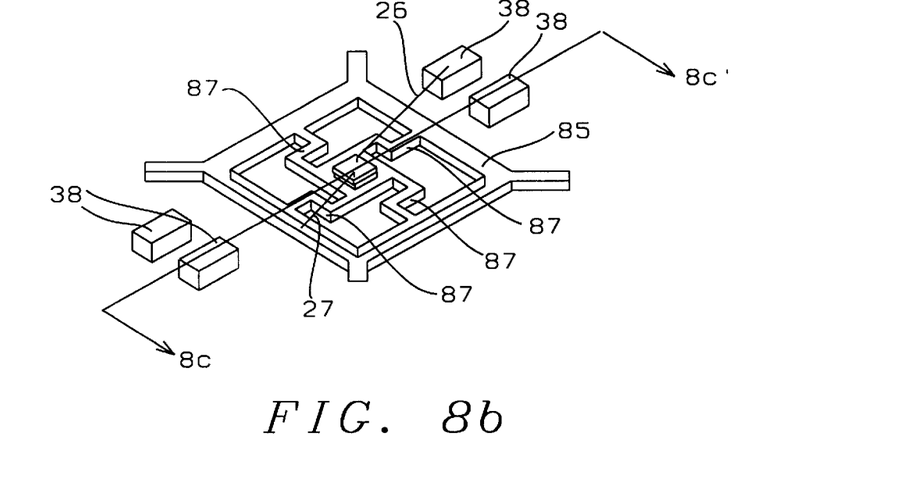
Figure 8C:
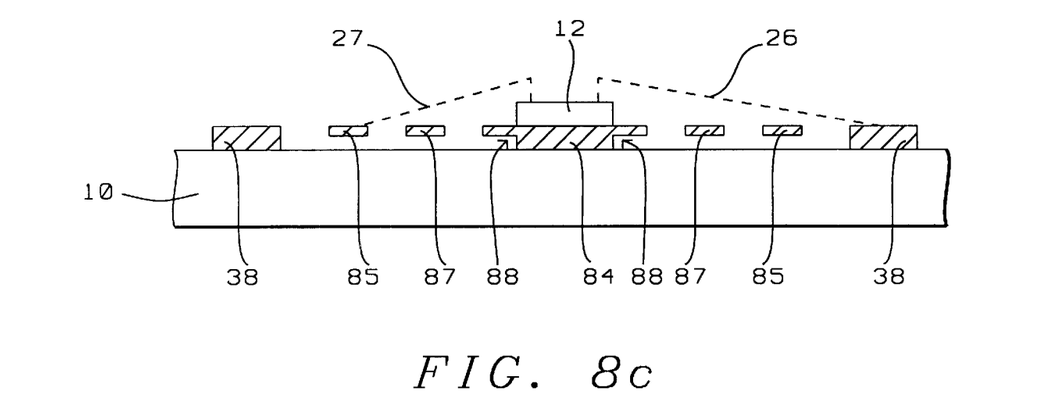

These latter observations are of value when considering the cross section that is shown in FIG. 8c, which is to be explained at a later time.

Figure 5D:
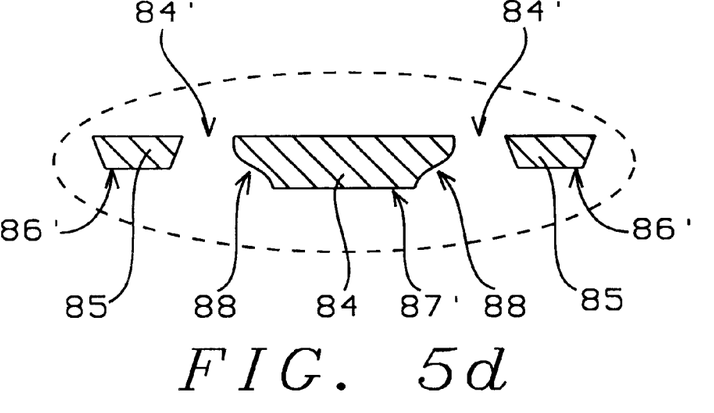

FIG. 5d shows a cross section after the photoresist mask 81 has been removed leaving in place die-paddle 84 and the ground ring 85. It is clear from the cross section that is shown in FIG. 5c that the plane of the lower surface 86' of the ground ring 85 is above the plane of the lower surface 87' of the die-paddle 84.

Figure 6:
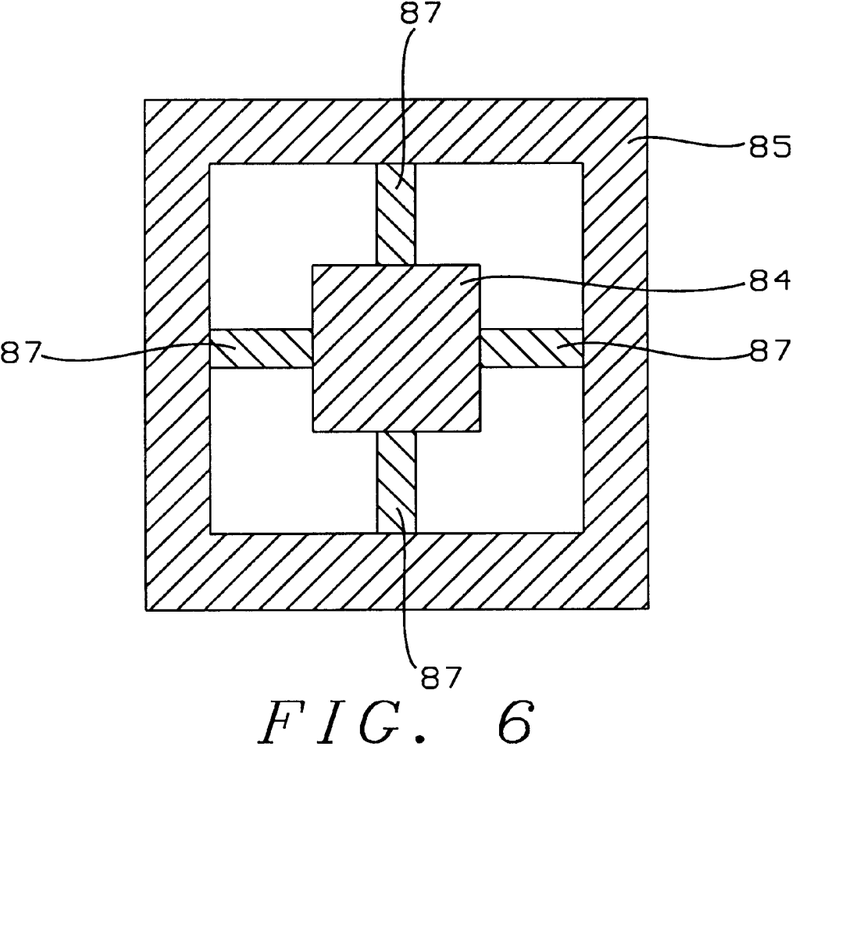
FIG. 6 shows a top view of the concept of the die-paddle design of the invention.

The concept of how the S-bar forms a mechanical interface between the ground ring 85 and the die-paddle 84 can further be highlighted using FIG. 6. The complete element, of which a top view is shown in FIG. 6, is created using one single layer of metal, preferably copper, like layer 80 of FIG. 5a. After the process of removing the metal between the ground ring and the die-paddle has been completed, following the steps that have been highlighted in FIGS. 5a through 5d, the structure that is shown in top view in FIG. 6 is obtained, containing:

84, the die-paddle over which the semiconductor die is mounted 85, the ground ring 87, the S-bars that form the physical interface between the die-paddle 84 and the ground ring 85; the S-bars 87 that are shown in FIG. 6 have been drawn as having a linear or straight design; in the application of the invention, the S-bar will have a design that is not straight so that the S-bar can meet one of the design objectives of the invention: that is to act as a stress-transfer interface or buffer between the die-paddle 84 and the ground ring 85.

Figure 7A:
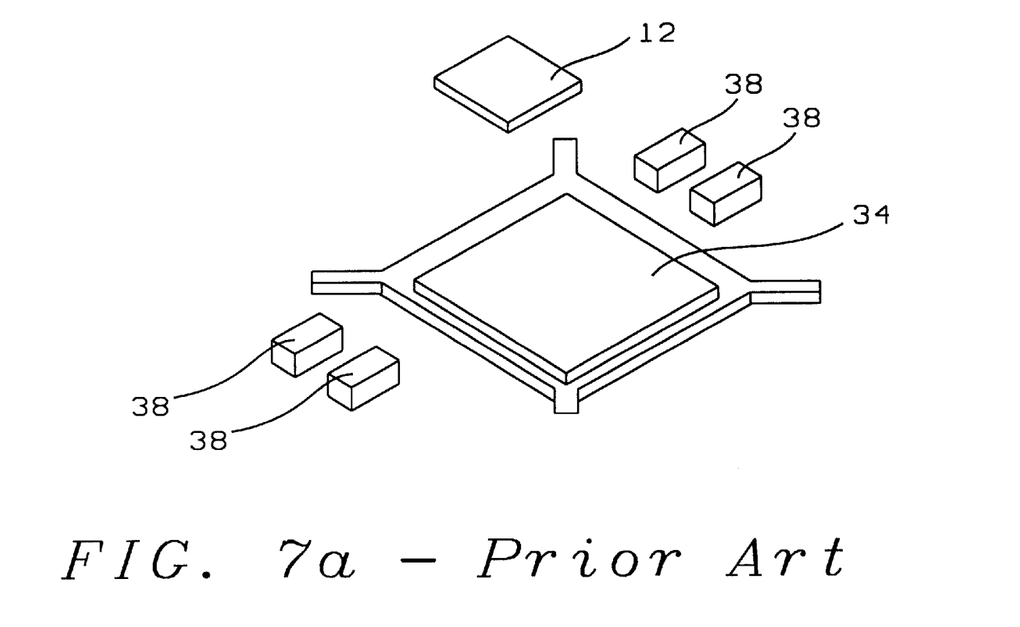
FIGS. 7a though 7c shows three dimensions view and a cross section of a conventional die-paddle design and its application.
Figure 7B:
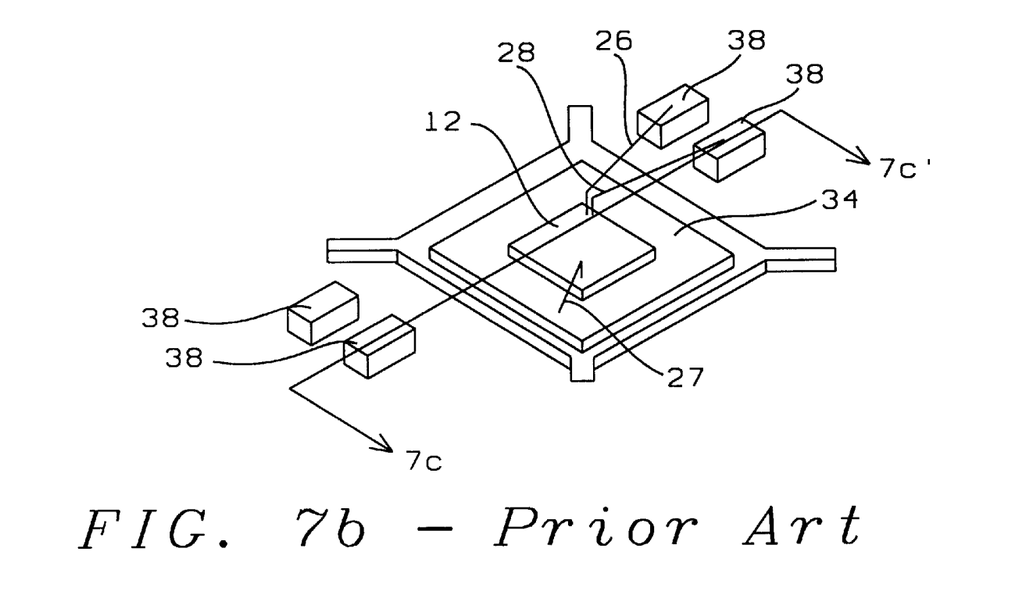
Figure 7C:
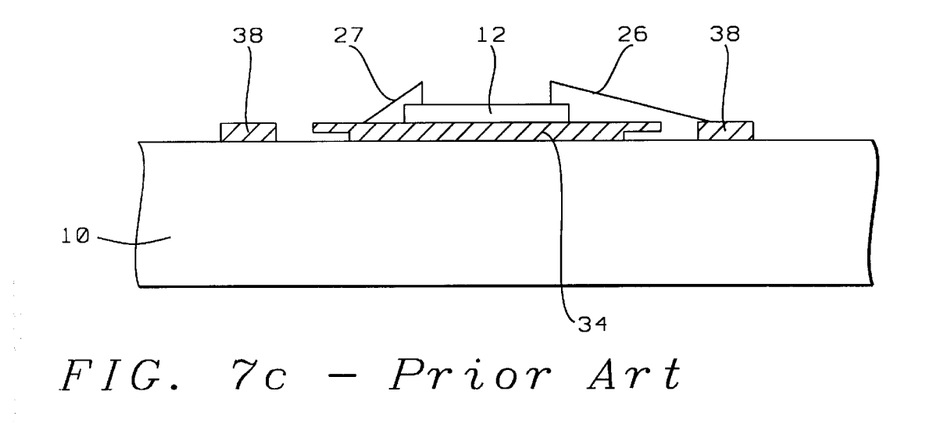

FIGS. 7a through 7c show a conventional construction of a die paddle and the surrounding ground ring, as follows:

12, a semiconductor die 34, the die-paddle 38, interconnect traces (as previously highlighted under for instance FIG. 3)

26 and 28, bond wires interconnecting the die to leads 35, and 27, an interconnect ground bond wire between die 12 and paddle 34.

In the three dimensional views and the cross section that are shown in FIGS. 7a through 7c, the following can be observed:

the design represents a standard or conventional die-paddle design; the frame that is used for the die-paddle forms both the die-paddle 34 and the interconnect leads 38; the semiconductor die 12 will be attached to the die-paddle during an assembly operation, and FIG. 7b shows the die mounted and bond wires 26 and 28 attached between the die 12 and the interconnect leads 38; lead 27, which connects between the die 12 and the die-paddle 34, is typically a ground wire.

Where FIG. 7a shows a three dimensional view of a die-paddle with the surrounding electrical components, FIG. 7b shows the same elements of have been shown in FIG. 7a but with the die 12 positioned above the die-paddle 34. Line 7c–7c' highlights the cross section that is taken of FIG. 7b and that is shown in FIG. 7c.

The invention can be better understood by comparing the views that are shown in FIG. 7a through 7c with the views that are shown in FIGS. 8a through 8c.

FIG. 8a shows a three dimensional view of the die-paddle and the surrounding elements, shown in the three dimensional view of FIG. 8a are the S-bars 87 which form a physical interface between the die-paddle 84 and the ground ring 85. In the three dimensional view that is shown in FIG. 8b, the die 12 has been mounted above the die-paddle 84, FIG. 8b also shows a line along which a cross section is taken which is shown in FIG. 8c. Further shown in FIG. 8b are bond wires 26 and 27 whereby wire 26 connects the die 12 to interconnect wires 38 and bond wire 27 connects die 12 to the ground ring 85.

FIG. 8c shows the cross section that is taken along line 8c–8c' of FIG. 8b. Clearly visible in this cross section is the cross section of S-bars 87, which are located between ground ring 85 and the die-paddle 84. Also to be noted from the cross section that is shown in FIG. 8c is the difference in height between the various elements that are shown. For instance, the height of the S-bars 87 and the ground ring 87 has been reduced to (about) half the height of the ground paddle 84. In addition an undercut 88 has been created in the die-paddle 84. Not shown in the cross section of FIG. 8c is the adhesive that is typically applied between the leadframe (comprising the elements 84, 87, 85, 38) and the heatsink 10.

Comparing FIG. 8c with the cross section that is shown in FIG. 7c provides a clear demonstration of the invention. The leads (not highlighted in FIG. 8a) that lead away from the ground ring 85 are shown merely for purposes of illustration and are, in FIG. 8a, terminated. In an actual circuit configuration, these leads are attached to interconnect traces provided in or on the surface of the main lead frame of the package. As previously stated, the die-paddle 84 is interconnected with the ground ring, the S-bars 87 of the invention form the physical interface between the die-paddle 84 and the ground ring 85. Further must be noted in the cross section that is shown in FIG. 8c that, in areas 88, the edge of the die-paddle has been partially removed, creating a step profile in the sides of the die-paddle.

It must further be noted that, where the cross section of FIG. 8c shows element 10 as being a metal heatsink, the surface over which the leadframe of the invention is mounted is not limited to being a metal heatsink. Element 10 can be a semiconductor surface that is selected from the group of surfaces consisting of semiconductor substrates, printed circuit boards, flex circuits, metallized substrates, glass substrates, ceramic substrates, gallium arsenide substrates, silicon substrates comprising a single layer of material, such as a silicon wafer or comprising silicon on insulator (SOI) technology and silicon on sapphire (SOS) technology, doped or undoped semiconductors, epitaxial layers of silicon supported by a base semiconductor, sapphire substrates or substrates used for flat panel displays.

Figures 9A, 9B:
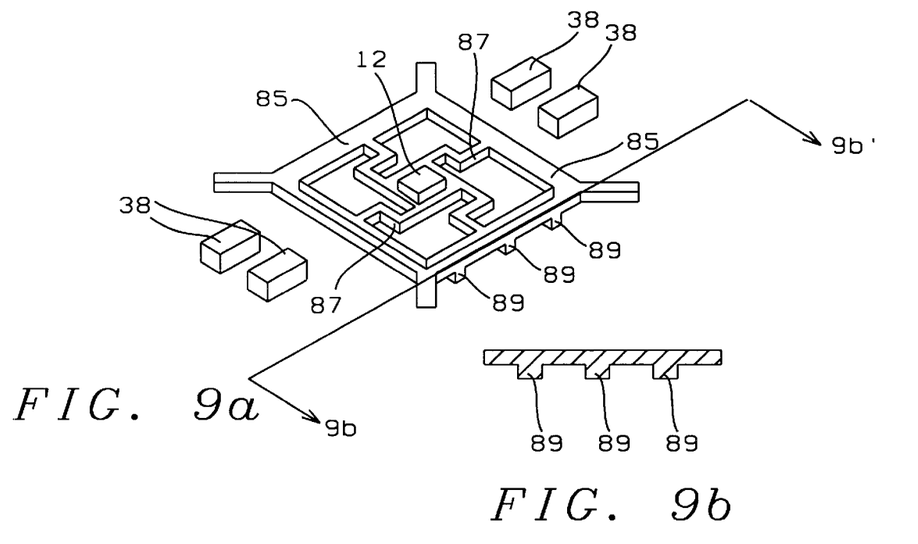
FIGS. 9a and 9b show a three dimensional view and a cross section of how the die-paddle of the invention can further be extended.

FIGS. 9a and 9b show an additional extension of the invention whereby optional tabs 89 have been provided, using the same process as selective metal etching as has been highlighted under FIG. 5a through 5d, along one of the surfaces of the ground ring 85. These additional tabs along the bottom surface of the ground ring may provide additional support during the process of assembly of the package. These additional tabs are not limited to the bottom surface of the ground ring 85 but may in addition be provided along the bottom surface of the S-bars 87 of the invention.

Figures 10A, 10C:
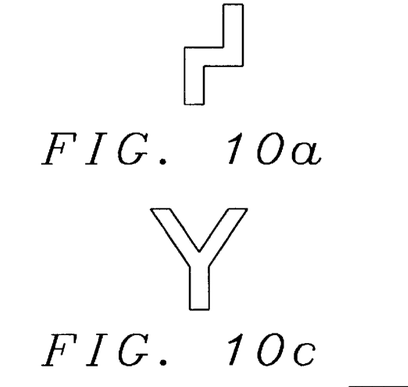
FIGS. 10a–10e shows examples of shapes that can be used for the S-bar that is part of the die-paddle design of the invention.
Figures 10B, 10D:
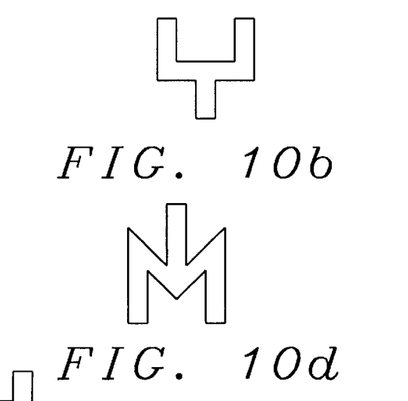
Figure 10E:
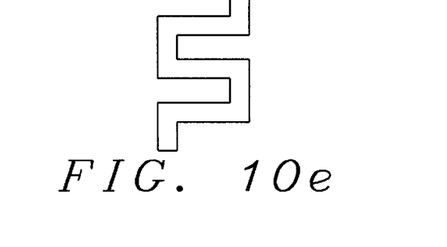

The actual shape in which the S-bar of the invention is created is not limited to one particular geometric shape such as the shape of the character "S" but can be extended to included such shapes as have been shown as examples in FIG. 10, examples "a" through "e". Any other configuration can be applied as long as this configuration connect the die-paddle to the ground ring and has a height that is less than the height of the die-paddle by a measurable amount.

As a final point it can be stated that the invention is not limited to any particular package design and is provided for exposed paddle design. Such applications, using a copper lead frame, will limit the invention to leadframe based products, excluding array substrate based products packages.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a semiconductor device mounting support for the mounting of a semiconductor device on the surface thereof, said method comprising the steps of:

providing a metal panel having a first and a second surface, a central surface area being provided over the second surface of said metal over which said semiconductor device is being mounted, the surface area of said central surface area being about equal in size to a surface area of said semiconductor device; and patterning and etching said metal panel, using methods of half-etch, creating a die-paddle in said central surface area being provided over the surface of said metal panel, further creating a conductive ground trace surrounding said die-paddle, further creating metal traces between said die-paddle and said conductive ground trace, further creating a network of input/output interconnect traces expanding from said central surface area of the metal panel towards the periphery of the metal panel, said interconnect traces providing means for interconnecting said semiconductor device that is mounted over said metal panel to at least one contact pad in the periphery of said metal panel, said methods of half-etch resulting in reducing a thickness of said conductive ground trace and said metal traces between said die-paddle and said conductive ground trace by a measurable amount, said reducing a thickness of said conductive ground trace and said metal traces proceeding from said first surface of said metal panel to said second surface of said metal panel.

2. The method of claim 1, said metal traces between said die-paddle and said conductive ground trace, when viewed in top view, having non-linear edges.

3. The method of claim 1, said metal traces between said die-paddle and said conductive ground trace, when viewed in top view, having a multiplicity of linear edges.

4. The method of claim 1, said methods of half-etch providing a means for not etching said metal panel or for partially etching said metal panel of for etching through said metal panel.

5. A method for creating a semiconductor package, comprising the steps of:

providing a semiconductor device mounting support having a first and a second surface;

providing a metal panel having a first and a second surface, a central surface area being provided over the surface of said metal over which said semiconductor device is being mounted, the surface area of said central surface area being about equal in size to a surface area of said semiconductor device; and patterning and etching said metal panel, using methods of half-etch, creating a die-paddle in said central surface area being provided over the surface of said metal panel, further creating a conductive ground trace surrounding said die-paddle, further creating metal traces between said die-paddle and said conductive ground trace, further creating a network of input/output interconnect traces expanding from said central surface area of the metal panel towards the periphery of the metal panel, said interconnect traces providing means for interconnecting said semiconductor device that is mounted over said metal panel to at least one contact pad in the periphery of said metal panel, said methods of half-etch resulting in reducing a thickness of said conductive ground trace and said metal traces between said die-paddle and said conductive ground trace by a measurable amount, said reduction in thickness proceeding from said first surface of said metal panel to said second surface of said metal panel;

applying a thermally conducting adhesive coating having a surface over the second surface of said semiconductor device mounting support; and attaching said first surface of said metal panel to the surface of said thermally conducting adhesive coating, thereby attaching said second surface of said semiconductor device mounting support to said first surface of said metal panel.

6. The method of claim 5, said metal traces between said die-paddle and said conductive ground trace, when viewed in top view, having non-linear edges.

7. The method of claim 5, said metal traces between said die-paddle and said conductive ground trace, when viewed in top view, having a multiplicity of linear edges.

8. The method of claim 5, said methods of half-etch providing a means for not etching said metal panel or for partially etching said metal panel of for etching through said metal panel.

9. The method of claim 5, said semiconductor device mounting support comprising a heatsink.

10. The method of claim 5, said semiconductor device mounting support being selected from the group consisting of semiconductor substrates, printed circuit boards, flex circuits, metallized substrates, glass substrates, ceramic substrates, gallium arsenide substrates, silicon substrates comprising a single layer of material, such as a silicon wafer or comprising silicon on insulator (SOI) technology and silicon on sapphire (SOS) technology, doped or undoped semiconductors, epitaxial layers of silicon supported by a base semiconductor, sapphire substrates or substrates used for flat panel displays.

11. A semiconductor package, comprising:

a semiconductor device mounting support having a first and a second surface;

a metal panel having a first and a second surface, a central surface area having been provided over the surface of said metal over which said semiconductor device is being mounted, the surface area of said central surface area being about equal in size to a surface area of said semiconductor device, said metal panel having been patterned and etched, using methods of half-etch, providing a die-paddle in said central surface area being provided over the surface of said metal panel, further providing a conductive ground trace surrounding said die-paddle, further providing metal traces between said die-paddle and said conductive ground trace, further providing a network of input/output interconnect traces expanding from said central surface area of the metal panel towards the periphery of the metal panel, said interconnect traces providing means for interconnecting said semiconductor device that is mounted over said metal panel to at least one contact pad in the periphery of said metal panel, said methods of half-etch having resulted in reducing a thickness of said conductive ground trace and said metal traces between said die-paddle and said conductive ground trace by a measurable amount, said reduction in thickness having been created when proceeding from said first surface of said metal panel to said second surface of said metal panel;

a thermally conducting adhesive coating having a surface applied over the second surface of said semiconductor device mounting support; and said first surface of said metal panel having been attached to the surface of said thermally conducting adhesive coating, thereby having attached said second surface of said semiconductor device mounting support to said first surface of said metal panel.

12. The semiconductor package of claim 11, said metal traces between said die-paddle and said conductive ground trace, when viewed in top view, having non-linear edges.

13. The semiconductor package of claim 11, said metal traces between said die-paddle and said conductive ground trace, when viewed in top view, having a multiplicity of linear edges.

14. The semiconductor package of claim 11, said methods of half-etch having provided a means for not etching said metal panel or for partially etching said metal panel of for etching through said metal panel.

15. The semiconductor package of claim 11, said semiconductor device mounting support comprising a heatsink.

16. The semiconductor package of claim 11, said semiconductor device mounting support being selected from the group consisting of semiconductor substrates, printed circuit boards, flex circuits, metallized substrates, glass substrates, ceramic substrates, gallium arsenide substrates, silicon substrates comprising a single layer of material, such as a silicon wafer or comprising silicon on insulator (SOI) technology and silicon on sapphire (SOS) technology, doped or undoped semiconductors, epitaxial layers of silicon supported by a base semiconductor, sapphire substrates or substrates used for flat panel displays.

* * * * *